(12) United States Patent
Kim et al.

(10) Patent No.: US 7,714,815 B2
(45) Date of Patent: May 11, 2010

(54) ORGANIC LIGHT EMITTING DISPLAY UTILIZING PARASITIC CAPACITORS FOR STORING DATA SIGNALS

(75) Inventors: Yang Wan Kim, Seoul (KR); Choon Yul Oh, Gunpo (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 916 days.

(21) Appl. No.: 11/251,607

(22) Filed: Oct. 13, 2005

(65) Prior Publication Data

US 2006/0107143 A1 May 18, 2006

(30) Foreign Application Priority Data

Oct. 13, 2004 (KR) .................. 10-2004-0081811

(51) Int. Cl.
G09G 3/32 (2006.01)
(52) U.S. Cl. .......................... 345/82; 345/83
(58) Field of Classification Search ........... 345/82–100, 345/76
See application file for complete search history.

(56) References Cited

U.S. PATENT DOCUMENTS

| | | | |
|---|---|---|---|
| 6,448,718 B1 | 9/2002 | Battersby | |
| 6,583,577 B1 | 6/2003 | Choi et al. | |
| 7,245,278 B2 * | 7/2007 | Hu et al. ..................... | 345/82 |
| 2002/0011976 A1 * | 1/2002 | Hashimoto .................. | 345/76 |
| 2002/0054005 A1 * | 5/2002 | Edwards et al. ............. | 345/87 |
| 2003/0057518 A1 * | 3/2003 | Schaper et al. ............. | 257/533 |
| 2003/0059525 A1 | 3/2003 | Moon | |
| 2003/0107537 A1 | 6/2003 | Ochi et al. | |
| 2003/0151567 A1 | 8/2003 | Hanada et al. | |
| 2003/0179164 A1 * | 9/2003 | Shin et al. .................. | 345/76 |
| 2003/0189535 A1 | 10/2003 | Matsumoto et al. | |
| 2004/0032217 A1 | 2/2004 | Abe et al. | |
| 2004/0061694 A1 * | 4/2004 | Noguchi et al. ............. | 345/204 |

(Continued)

FOREIGN PATENT DOCUMENTS

CN 1437178 A 8/2003

(Continued)

OTHER PUBLICATIONS

European Search Report for EP 05109386.2-2205 dated Dec. 19, 2005.

(Continued)

*Primary Examiner*—Amr Awad
*Assistant Examiner*—Liliana Cerullo
(74) *Attorney, Agent, or Firm*—Christie, Parker & Hale, LLP

(57) ABSTRACT

An organic light emitting display including a demultiplexer on each data line that splits and supplies each data signal to a plurality of data lines, thereby decreasing the number of output lines required and reducing production cost. Further, voltages corresponding to the data signals are sequentially charged in data capacitors, while the charged voltages are supplied to the pixels simultaneously allowing the organic light emitting display to display an image with uniform brightness. Scan periods for supplying the scan signals do not overlap with data periods for supplying the data signals thus yielding a stable image. Also, the capacitance of the data capacitor is set to compensate the voltage drop in the first power source line, thereby displaying an image with uniform brightness.

9 Claims, 10 Drawing Sheets

U.S. PATENT DOCUMENTS

2004/0125067 A1* 7/2004 Kim et al. .................... 345/98

FOREIGN PATENT DOCUMENTS

| | | |
|---|---|---|
| CN | 1450517 A | 10/2003 |
| CN | 1156813 C | 7/2004 |
| EP | 1 347 436 A2 | 9/2003 |
| EP | 1 347 436 A3 | 3/2005 |
| JP | 2001-92413 | 4/2001 |
| JP | 2003-140626 A | 5/2003 |

OTHER PUBLICATIONS

Patent Gazette for corresponding CN 100444229C dated Dec. 17, 2008 indicating the relevance of cited references.

* cited by examiner

ORGANIC LIGHT EMITTING DISPLAY UTILIZING PARASITIC CAPACITORS FOR STORING DATA SIGNALS

CROSS-REFERENCE TO RELATED APPLICATION

This application claims the benefit of Korean Patent Application No. 2004-81811, filed on Oct. 13, 2004, in the Korean Intellectual Property Office, the entire content of which is incorporated herein by reference.

BACKGROUND OF THE INVENTION

1. Field of the Invention

The present invention relates to an organic light emitting display, and more particularly, to an organic light emitting display, in which the number of output lines provided in a data driver is decreased while the image is displayed with uniform brightness.

2. Discussion of Related Art

Recently, various flat panel displays have been developed, which are substituting for a cathode ray tube (CRT) display because the CRT display is relatively heavy and bulky. The flat panel displays include liquid crystal displays (LCD), field emission displays (FED), plasma display panels (PDP), and organic light emitting displays among other types.

Among the flat panel displays, the organic light emitting display includes organic light emitting diodes that emit light by electron-hole recombination. These organic light emitting displays have a faster response time than the LCDs that require a separate light source.

FIG. 1 illustrates a conventional organic light emitting display. A conventional organic light emitting display includes a pixel portion 30 including a plurality of pixels 40 formed in an intersection region of a plurality of scan lines S1 through Sn and a plurality of data lines D1 through Dm. A conventional organic light emitting display also includes a scan driver 10 to drive the scan lines S1 through Sn; a data driver 20 to drive the data lines D1 through Dm; and a timing controller 50 to control the scan driver 10 and the data driver 20.

The scan driver 10 generates scan signals in response to scan control signals SCS transmitted from the timing controller 50, and supplies the scan signals to the scan lines S1 through Sn in sequence. Further, the scan driver 10 generates emission control signals in response to the scan control signals SCS, and supplies the emission control signals to emission control lines E1 through En in sequence.

The data driver 20 generates data signals in response to data control signals DCS transmitted from the timing controller 50, and supplies the data signals to the data lines D1 through Dm. The data driver 20 supplies the data signal corresponding to one horizontal line per horizontal period to the data lines D1 through Dm.

The timing controller 50 generates the data control signals DCS and the scan control signals SCS in response to external synchronization signals. The data control signal DCS is transmitted to the data driver 20, and the scan control signal SCS is transmitted to the scan driver 10. Further, the timing controller 50 rearranges external data Data and supplies it to the data driver 20.

The pixel portion 30 receives external first power from an external first power source line ELVDD and external second power from an external second power source line ELVSS. The first power from the first power source line ELVDD and the second power from the second power source line ELVSS are supplied to each pixel 40. Each pixel 40 receives the data signal and displays an image corresponding to the data signal. Further, the emission time of the pixels 40 is controlled by the emission control signals.

In the conventional organic light emitting display, the pixels 40 are placed in the intersection regions of the scan lines S1 through Sn and the data lines D1 through Dm. The data driver 20 includes m output lines to supply the data signals to m data lines D1 through Dm. That is, the data driver 20 of the conventional organic light emitting display should have the same number of output lines as the number of the data lines D1 through Dm. To have m output lines, the data driver 20 needs to include a plurality of data integrated circuits that increase the production cost. Particularly, as the resolution and the size of the pixel portion 30 increase, the number of output lines of the data driver 20 increases. Thus, the production cost of the organic light emitting display is increased.

Therefore, there is a need for organic light emitting displays that require fewer output lines and therefore fewer data integrated circuits in their data driver. There is also a need for an organic light emitting display that displays a stable image with high uniformity.

SUMMARY OF THE INVENTION

Accordingly, it is an aspect of the present invention to provide an organic light emitting display, in which the number of output lines provided in a data driver is decreased, and an image is displayed with uniform brightness.

The foregoing and/or other aspects of the present invention are achieved by providing an organic light emitting display including a scan driver to supply scan signals to a plurality of scan lines; a data driver to supply data signals to a plurality of output lines; a demultiplexer provided on each output line to supply the data signal to a plurality of data lines; a first power source line to supply first power through a first side of a plurality of pixel power source lines; a pixel portion including a pixel coupled to the scan line, the data line, the pixel power source line to emit light corresponding to the data signal; and a plurality of capacitors formed to have different capacitances according to overlapping areas between the first power source line and the respective data lines, storing voltage corresponding to the data signal, and supplying the stored voltage to the pixel.

According to an embodiment of the invention, at least two data lines are different in length from each other in the overlapping area with the first power source line. According to another embodiment, at least two data lines are different in width from each other in the overlapping area with the first power source line.

DETAILED DESCRIPTION

Figure 1:
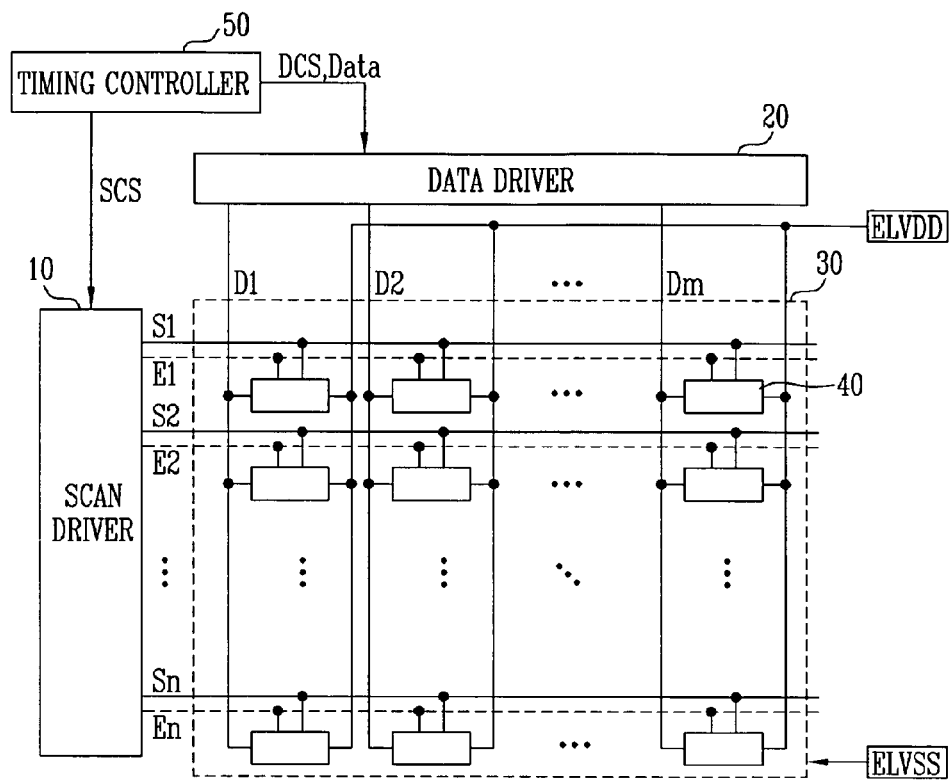
FIG. 1 illustrates a conventional organic light emitting display.
Figure 2:
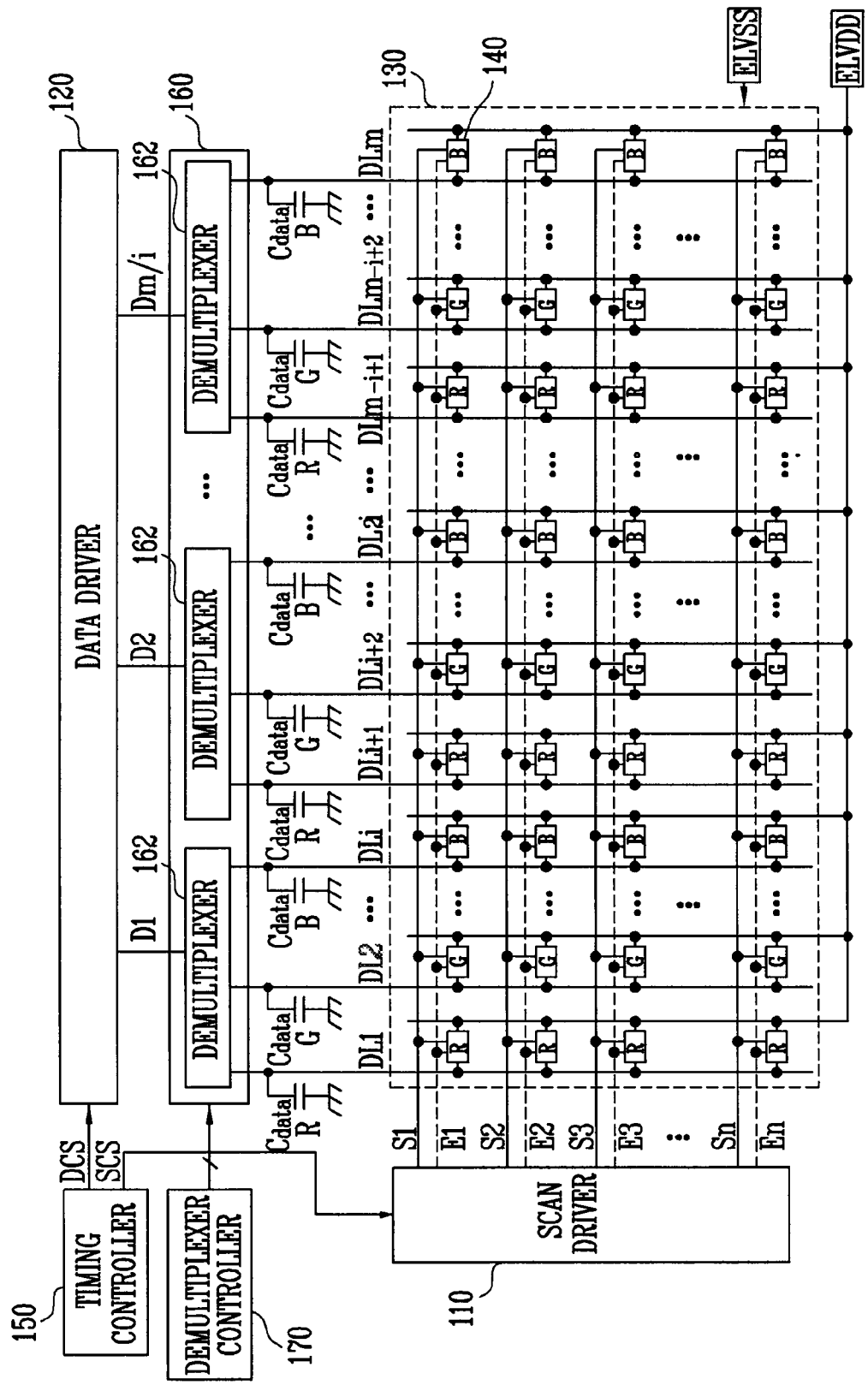
FIG. 2 illustrates an organic light emitting display according to an embodiment of the present invention.

FIG. 2 illustrates an organic light emitting display according to an embodiment of the present invention.

The organic light emitting display includes a scan driver 110, a data driver 120, a pixel portion 130, a timing controller 150, a demultiplexer block 160, a demultiplexer controller 170, and data capacitors Cdata.

The pixel portion 130 includes a plurality of pixels 140 placed adjacent to regions defined by a plurality of scan lines S1 through Sn and a plurality of second data lines DL1 through DLm. Each pixel 140 emits light corresponding to a data signal transmitted through the second data line DL. The demultiplexer block 160 includes demultiplexers 162.

Figure 3:
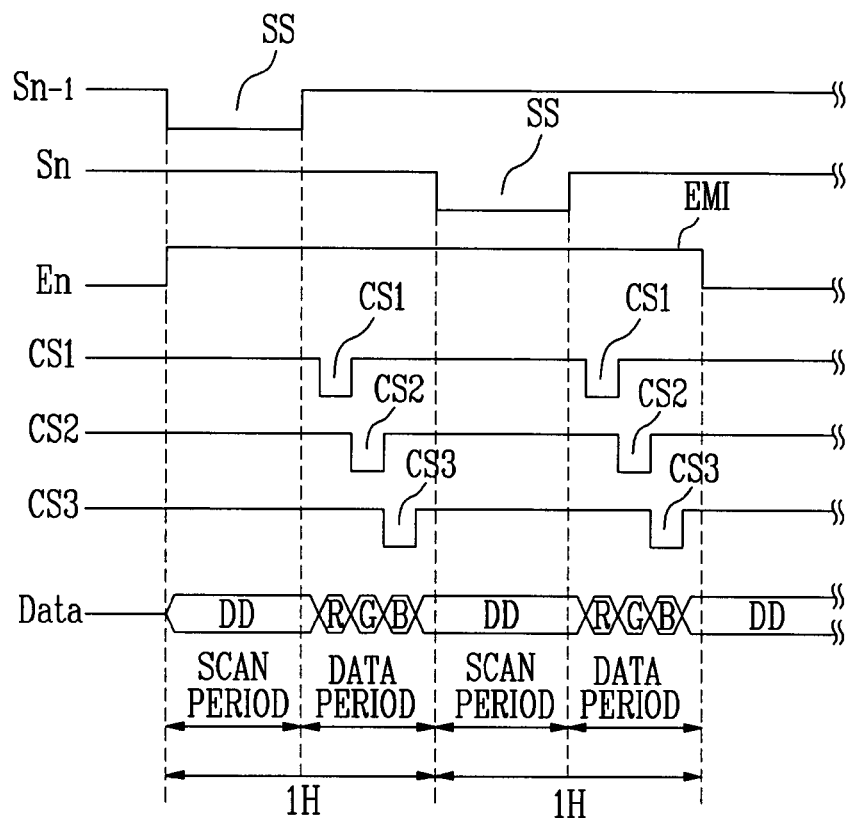
FIG. 3 illustrates waveforms of driving signals supplied to a scan line, a data line and the demultiplexer of FIG. 2.

FIG. 3 illustrates waveforms of driving signals supplied to the scan lines, the data lines, and the demultiplexers of FIG. 2. The figure shows scan signals SS applied to the $n^{th}$ scan line Sn and the $(n-1)^{th}$ scan line Sn−1, emission control signals EMI applied to the emission control lines En, first, second, and third control signals CS1, CS2, CS3, and external data Data signals. The first, second, and third control signals CS1, CS2, CS3 are provided from the demultiplexer controller 170 to the pixels 140. Different parts of FIG. 3 pertain to various of the following figures and are discussed below together with the discussion of the pertinent figure. Further, the low or high position of the signals of FIG. 3 correspond to the transistor types of the circuits being driven by these signals. The circuits that are shown in the following figures may be implemented in NMOS as well as PMOS. Therefore, it is understood that driving signals of polarity opposite those shown would apply if the transistor type is changed.

The scan driver 110 generates scan signals SS in response to scan control signals SCS supplied from the timing controller 150, and supplies the scan signals SS to the scan lines S1 through Sn in sequence. The scan driver 110 supplies the scan signal SS during a predetermined period included in the one horizontal period 1H. For example, in one embodiment shown in FIG. 3, the one horizontal period 1H is divided into a scan period (first period) and a data period (second period). The scan driver 110 supplies the scan signal SS to the scan lines S1 through Sn during the scan period of the one horizontal period 1H. On the other hand, the scan driver 110 does not supply the scan signal SS during the data period of the one horizontal period 1H. The scan driver 110 also generates the emission control signals EMI in response to the scan control signals SCS, and supplies the emission control signals EMI to emission control lines E1 through En in sequence.

The data driver 120 generates the data signal in response to a data control signal DCS supplied from the timing controller 150, and supplies the data signals to a plurality of first data lines D1 through Dm/i. The data driver 120 supplies i data signals (where i is a natural number of 2 or more) to the first data lines D1 through Dm/i that are coupled to output lines of the data driver 120 in sequence.

For example, the data driver 120 supplies data signals R, G, B to the pixels 140 in sequence during the data period of the one horizontal period 1H. The data signals R, G, B are supplied during only the data period, so that supplying the data signals R, G, B does not overlap with supplying the scan signal SS. During the scan period of the one horizontal period 1H, the data driver 120 supplies a merely dummy data signal DD.

The timing controller 150 generates the data control signals DCS and the scan control signals SCS corresponding to external synchronization signals. The data control signals DCS generated by the timing controller 150 are supplied to the data driver 120, and the scan control signals SCS generated by the timing controller 150 are supplied to the scan driver 110.

The demultiplexer block 160 includes m/i demultiplexers 162. In other words, the demultiplexer block 160 has the same number of demultiplexers 162 as the number of the first data lines D1 through Dm/i. The demultiplexers 162 are coupled to the first data lines D1 through Dm/i, respectively. The demultiplexers 162 are also coupled to i second data lines DL1 through DLm, respectively. Thus, each demultiplexer 162 supplies the i data signals R, G, B received through each first data lines D, from the data driver 120 during the data periods, to the i second data lines DL.

Accordingly, as the data signal R, G, B received through one first data line D is supplied to i second data lines DL, the number of output lines required in the data driver 120 is markedly decreased. For instance, when i is 3, the number of output lines provided in the data driver 120 is decreased to ⅓ of the number of output lines required with no demultiplexing (i of one). Thus, the number of data integrated circuits provided in the data driver 120 is decreased. Employing the demultiplexer 162 for supplying the data signal R, G, B of one first data line D to i second data lines DL, helps reduce the production cost of the organic light emitting display.

The demultiplexer controller 170 supplies i control signals to the respective demultiplexers 162 during the data period in the one horizontal period 1H, thereby splitting the data signal from one of the first data lines D into i data signals and supplying i data signals to i second data lines DL. As shown in FIG. 3, the demultiplexer controller 170 supplies the i control signals in sequence, so that the i control signals do not overlap. In the exemplary embodiment shown in FIG. 2, the demultiplexer controller 170 is separately provided outside the timing controller 150. However, the invention is not limited to this configuration and the demultiplexer controller 170 may be integrally provided inside the timing controller 150.

One data capacitor Cdata is provided in every second data line DL. The data capacitor Cdata temporarily stores the data signal R, G, B supplied to the second data line DL, and subsequently supplies the stored data signal R, G, B to the pixel 140. In one embodiment, the data capacitor Cdata is a parasitic capacitor equivalently formed by the second data line DL. In one embodiment, the capacitance of the parasitic capacitor equivalently formed by the second data line DL is larger than the capacitance of a storage capacitor Cst provided in every pixel 140 (refer to FIG. 5). This relationship between the two capacitance values causes stable storing of the data signal R, G, B in the storage capacitance Cst of the pixel 140.

Figure 4:
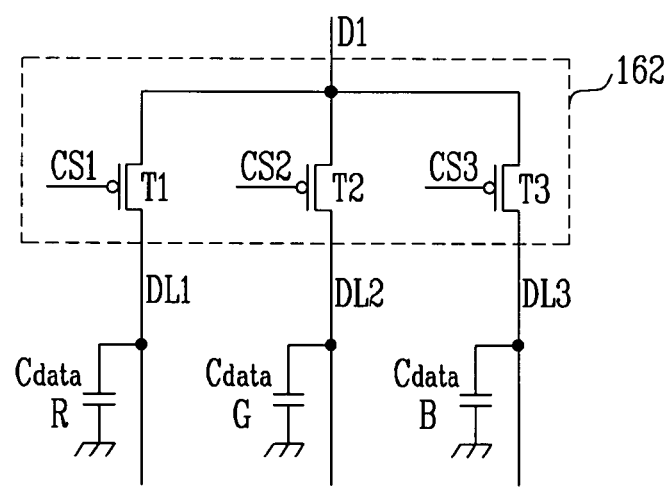
FIG. 4 is a circuit diagram of a demultiplexer illustrated in FIG. 2.

FIG. 4 is a circuit diagram of the demultiplexer 162 illustrated in FIG. 2. In this figure, for the sake of convenience, i is 3 and the demultiplexer 162 is coupled to the $1^{st}$ one of the first data lines D1.

Each demultiplexer 162 includes a first switching device T1, a second switching device T2, and a third switching device T3. The switching devices may be transistors.

The first switching device T1 is coupled between the 1st first data line D1 and the $1^{st}$ second data line DL1. The first switching device T1 is turned on when it receives the first control signal CS1 from the demultiplexer controller 170, and supplies the data signal R, G, B from the $1^{st}$ first data line D1 to the $1^{st}$ second data line DL1. The data signal R, G, B supplied to the $1^{st}$ second data line DL1 is temporarily stored in the first data capacitor Cdata1.

The second switching device T2 is coupled between the $1^{st}$ first data line D1 and the $2^{nd}$ second data line DL2. The second switching device T2 is turned on when it receives the second control signal CS2 from the demultiplexer controller 170, and supplies the data signal from the $1^{st}$ first data line D1 to the $2^{nd}$ second data line DL2. The data signal supplied to the $2^{nd}$ second data line DL2 is temporarily stored in the second data capacitor Cdata2.

The third switching device T3 is coupled between the $1^{st}$ first data line D1 and the $3^{rd}$ second data line DL3. The third switching device T3 is turned on when it receives the third control signal CS3 from the demultiplexer controller 170, and supplies the data signal from the $1^{st}$ first data line D1 to the $3^{rd}$ second data line DL3. The data signal supplied to the $3^{rd}$ second data line DL3 is temporarily stored in the third data capacitor Cdata3.

Figure 5:
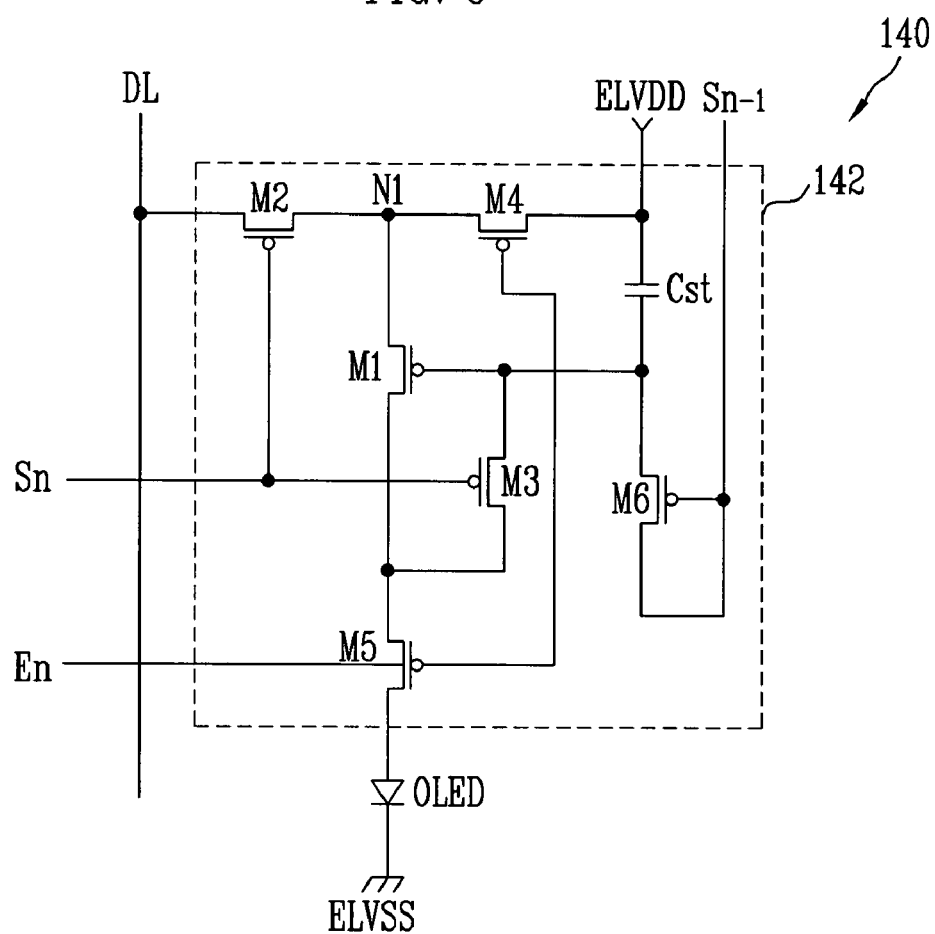
FIG. 5 is a circuit diagram of a pixel illustrated in FIG. 2.

Operation of the demultiplexer 162 with the pixel 140 are described in the context of the exemplary circuit configurations of FIGS. 4 and 5.

FIG. 5 is a circuit diagram of the pixel 140 illustrated in FIG. 2. The pixel 140 of the invention is not limited to the circuit shown in FIG. 5, and may include other configurations. For example, the circuit may include at least one transistor capable of being used as a diode.

Each pixel 140 includes a pixel circuit 142 coupled to the second data line DL, the scan line Sn, the emission control line En, and an organic light emitting diode OLED. The pixel circuit 142 controls the organic light emitting diode OLED and causes it to emit light.

The organic light emitting diode OLED includes an anode electrode coupled to the pixel circuit 142, and a cathode electrode coupled to the second power source line ELVSS. The second power source line ELVSS applies a voltage lower than the voltage of the first power source line ELVDD. For example, the second power source line ELVSS may be at ground voltage. The organic light emitting diode OLED includes fluorescent and/or phosphorescent organic material that allow it to emit light when receiving a current supplied from the pixel circuit 142.

The pixel circuit 142 includes a storage capacitor Cst and first, second, thrid, fourth, fifth, and sixth transistors M1, M2, M3, M4, M5, M6. The storage capacitor Cst and the sixth transistor M6 are coupled between the first power source line ELVDD and the $(n-1)^{th}$ scan line Sn−1. The second transistor M2 and the fourth transistor M4 are coupled together forming a first node N1 and are also coupled between the first power source line ELVDD and the second data line DL. The fifth transistor M5 is coupled between the organic light emitting diode OLED and the emission control line En. The first transistor M1 is coupled between the fifth transistor M5 and the first node N1. The third transistor M3 is coupled between gate and drain terminals of the first transistor M1. In the exemplary embodiment shown in FIG. 5, the first through sixth transistors M1 through M6 are of a p-type metal oxide semiconductor field effect transistor (PMOSFET), but the invention is not limited to this particular exemplary configuration. Alternatively, the first through sixth transistors M1 through M6 may be of an n-type metal oxide semiconductor field effect transistor (NMOSFET). As well known to those skilled in the art, in the case where the first through sixth transistors M1 through M6 are of the NMOSFET type, polarity of driving waveforms is reversed.

The first transistor M1 includes a source terminal coupled to the first node N1, the drain terminal coupled to a source terminal of the fifth transistor M5, and the gate terminal coupled to the storage capacitor Cst. Further, the first transistor M1 supplies current corresponding to voltage charged in the storage capacitor Cst to the organic light emitting diode OLED.

The third transistor M3 includes a drain terminal coupled to the gate terminal of the first transistor M1, a source terminal coupled to the drain terminal of the first transistor M1, and a gate terminal coupled to the $n^{th}$ scan line Sn. The third transistor M3 is turned on when the scan signal SS is transmitted to the $n^{th}$ scan line Sn, and thus causes the first transistor M1 to be coupled like a diode. That is, when the third transistor M3 is turned on, the first transistor M1 functions as a diode.

The second transistor M2 includes a source terminal coupled to the second data line DL, a drain terminal coupled to the first node N1, and a gate terminal coupled to the $n^{th}$ scan line Sn. The second transistor M2 is turned on when the scan signal SS is transmitted to the $n^{th}$ scan line Sn. A turned-on second transistor M2 transmits the data signal R, G, B from the second data line DL to the first node N1.

The fourth transistor M4 includes a drain terminal coupled to the first node N1, a source terminal coupled to the first power source line ELVDD, and a gate terminal coupled to the emission control line En. The fourth transistor M4 is turned on when the emission control signal EMI is not being supplied. A turned-on fourth transistor electrically couples the first power source line ELVDD with the first node N1.

The fifth transistor M5 includes the source terminal that is coupled to the drain terminal of the first transistor M1, a drain terminal coupled to the organic light emitting diode OLED, and a gate terminal coupled to the emission control line E. The fifth transistor M5 is turned on when the emission control signal EMI is not being supplied, thereby supplying current from the first transistor M1 to the organic light emitting diode OLED.

The sixth transistor M6 includes a source terminal coupled to the storage capacitor Cst, and drain and gate terminals coupled to the $(n-1)^{th}$ scan line Sn−1. Further, the sixth transistor M6 is turned on when the scan signal SS is transmitted to the $(n-1)^{th}$ scan line Sn−1, thereby initializing the storage capacitor Cst and the gate terminal of the first transistor M1.

Figure 6:
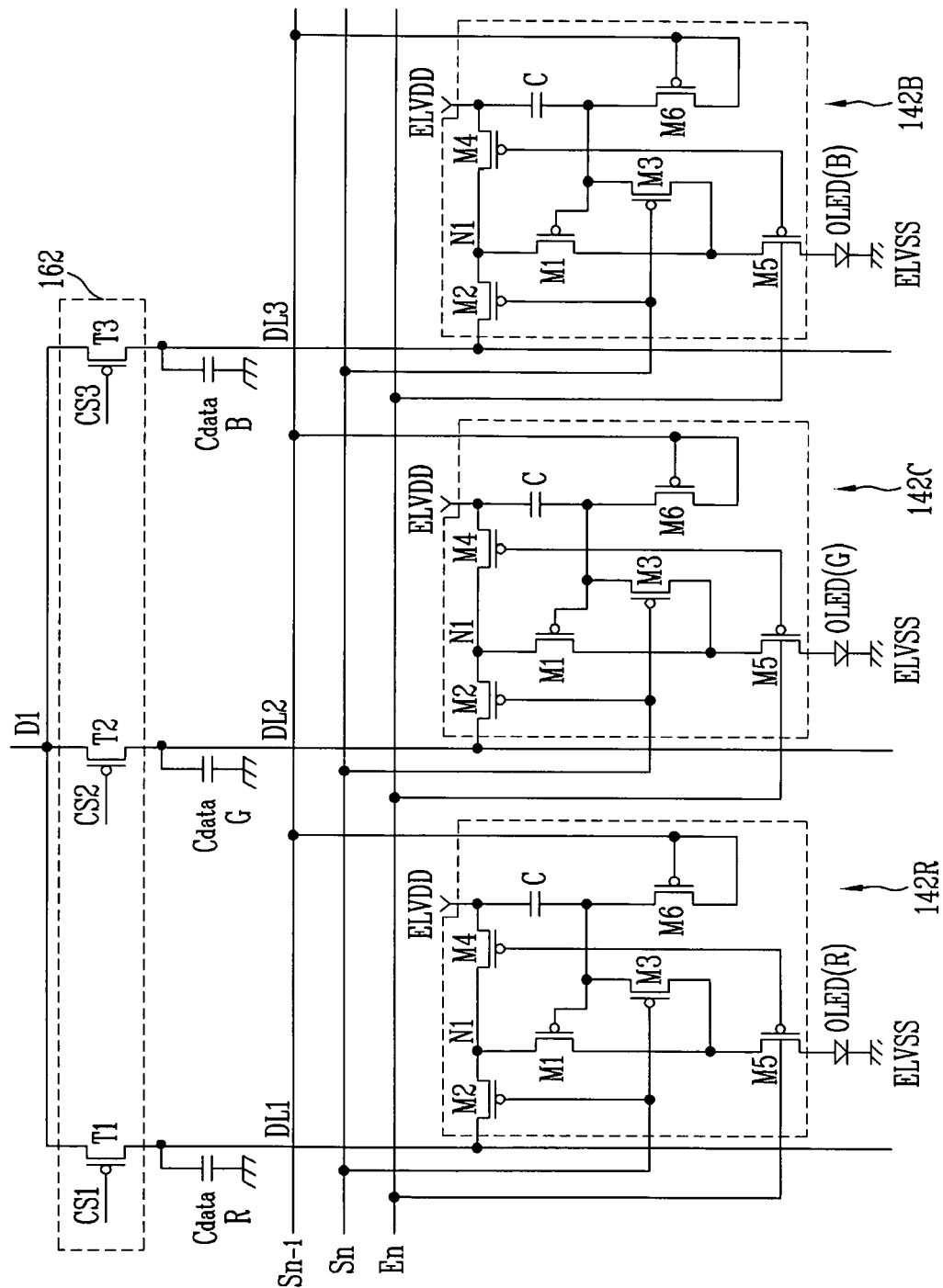
FIG. 6 is a circuit diagram illustrating coupling of the demultiplexer circuit of FIG. 4 to the pixel circuit of FIG. 5.

FIG. 6 is a circuit diagram illustrating the coupling of the demultiplexer 162 of FIG. 4 to the pixel circuit 142 of FIG. 5. In the exemplary embodiment shown, one demultiplexer 162 is coupled with three pixel circuit of red (R) 142R, green (G) 142G, and blue (B) 142B, so that i is 3.

The operations of the demultiplexer 162 and the pixel 140 are described with reference to FIGS. 3 and 6. First, the scan signal SS is transmitted to the $(n-1)^{th}$ scan line Sn−1 during the scan period of the one horizontal period 1H. When the scan signal SS is transmitted to the $(n-1)^{th}$ scan line Sn−1, each sixth transistor M6 of the pixels 142R, 142G and 142B is turned on. As the sixth transistor M6 is turned on, the storage capacitor Cst and the gate terminal of the first transistor M1 are coupled to the $(n-1)^{th}$ scan line Sn−1. That is, when the scan signal SS is transmitted to the $(n-1)^{th}$ scan line Sn−1, the scan signal SS is supplied to each storage capacitor Cst and each gate terminal of the first transistor M1 provided in the pixels 142R, 142G and 142B, thereby initializing each storage capacitor Cst and each gate terminal of the first transistor M1. The scan signal SS has a voltage level lower than the data signal R, G, B.

When the scan signal SS is transmitted to the $(n-1)^{th}$ scan line Sn−1, the second transistor M2 coupled to the $n^{th}$ scan line Sn remains turned off.

Then, the first, second, and third switching devices T1, T2, T3 are turned on in sequence by the first, second, and third control signals CS1, CS2, CS3 transmitted in sequence during the data period. When the first switching device T1 is turned on by the first control signal CS1, the data signal R, G, B is transmitted from the 1$^{st}$ first data line D1 to the 1$^{st}$ second data line DL1. The first data capacitor Cdata1 is charged with voltage corresponding to the data signal R, G, B transmitted to the 1$^{st}$ second data line DL1.

When the second switching device T2 is turned on by the second control signal CS2, the data signal R, G, B is transmitted from the 1$^{st}$ first data line D1 to the 2$^{nd}$ second data line DL2. The second data capacitor Cdata2 is charged with voltage corresponding to the data signal R, G, B transmitted to the 2$^{nd}$ second data line DL2. When the third switching device T3 is turned on by the third control signal CS3, the data signal R, G, B is transmitted from the 1$^{st}$ first data line D1 to the 3$^{rd}$ second data line DL3. The third data capacitor Cdata3 is charged with voltage corresponding to the data signal R, G, B transmitted to the 3$^{rd}$ second data line DL3. As seen in FIG. 3, the first, second, and third control signals CS1, CS2, CS3 are supplied during data periods of the one horizontal period 1H. However, the scan signal SS is not supplied during the data period, and, therefore, the data signal R, G, B is not being supplied to the pixels 142R, 142G and 142B while the control signals are being supplied.

Following the data period, the scan signal SS is transmitted to the n$^{th}$ scan line Sn. When the scan signal SS is transmitted to the n$^{th}$ scan line Sn, each second transistor M2 and each third transistor M3 of the pixels 142R, 142G and 142B are turned on. As each second transistor M2 and each third transistor M3 of the pixels 142R, 142G and 142B turn on, voltages corresponding to the data signals R, G, B stored in the first through third data capacitor Cdata1, Cdata2, Cdata3 are supplied to the respective first nodes N1 of the pixels 142R, 142G and 142B.

When the scan signal SS transmitted to the (n−1)$^{th}$ scan line Sn−1 is set to have a voltage level lower than that of the data signal R, G, B applied to the first node N1, the first transistor M1 is turned on. The voltage applied to the gate terminal of each first transistor M1 provided in the pixels 142R, 142G and 142B is initialized by this scan signal SS transmitted to the (n−1)$^{th}$ scan line Sn−1. As the first transistor M1 is turned on, the voltage corresponding to the data signal R, G, B applied to the first node N1 is supplied to one terminal of the storage capacitor Cst via the first transistor M1 and the third transistor M3. As a result, each storage capacitor Cst provided in the pixels 142R, 142G and 142B is charged with voltage corresponding to the data signal R, G, B. In addition to the voltage corresponding to the data signal R, G, B, the storage capacitors Cst are also charged with voltage corresponding to the threshold voltage of the first transistor M1. While the emission control signal EMI is not supplied through the emission control line En, the fourth and fifth transistors M4 and M5 are turned on and current corresponding to the voltage charged in the storage capacitor Cst is supplied to each organic light emitting diode OLED(R), OLED(G), OLED(B), causing them to emit light.

Thus, according to an embodiment of the present invention, the demultiplexer 162 is employed for splitting and supplying the data signal R, G, B from one of the first data lines D1 to i second data lines DL. The data capacitor Cdata1, Cdata2, Cdata3 is charged with the voltage corresponding to the data signal R, G, B during the data period, and supplies the charged voltage to the pixel 140 during the scan period. According to an embodiment of the present invention, the scan period for supplying the scan signal SS and the data period for supplying the data signal R, G, B do not overlap. As a result, the voltage applied to the gate terminal of the third transistor M3 does not fluctuate, allowing the organic light emitting display to stably display an image. Further, the voltages stored in the data capacitors Cdata1, Ddata2, Cdata3, corresponding to the data signals R, G, B, are supplied to the pixels 140 at the same time. As a result, the organic light emitting display can display an image with uniform brightness.

Figure 7:
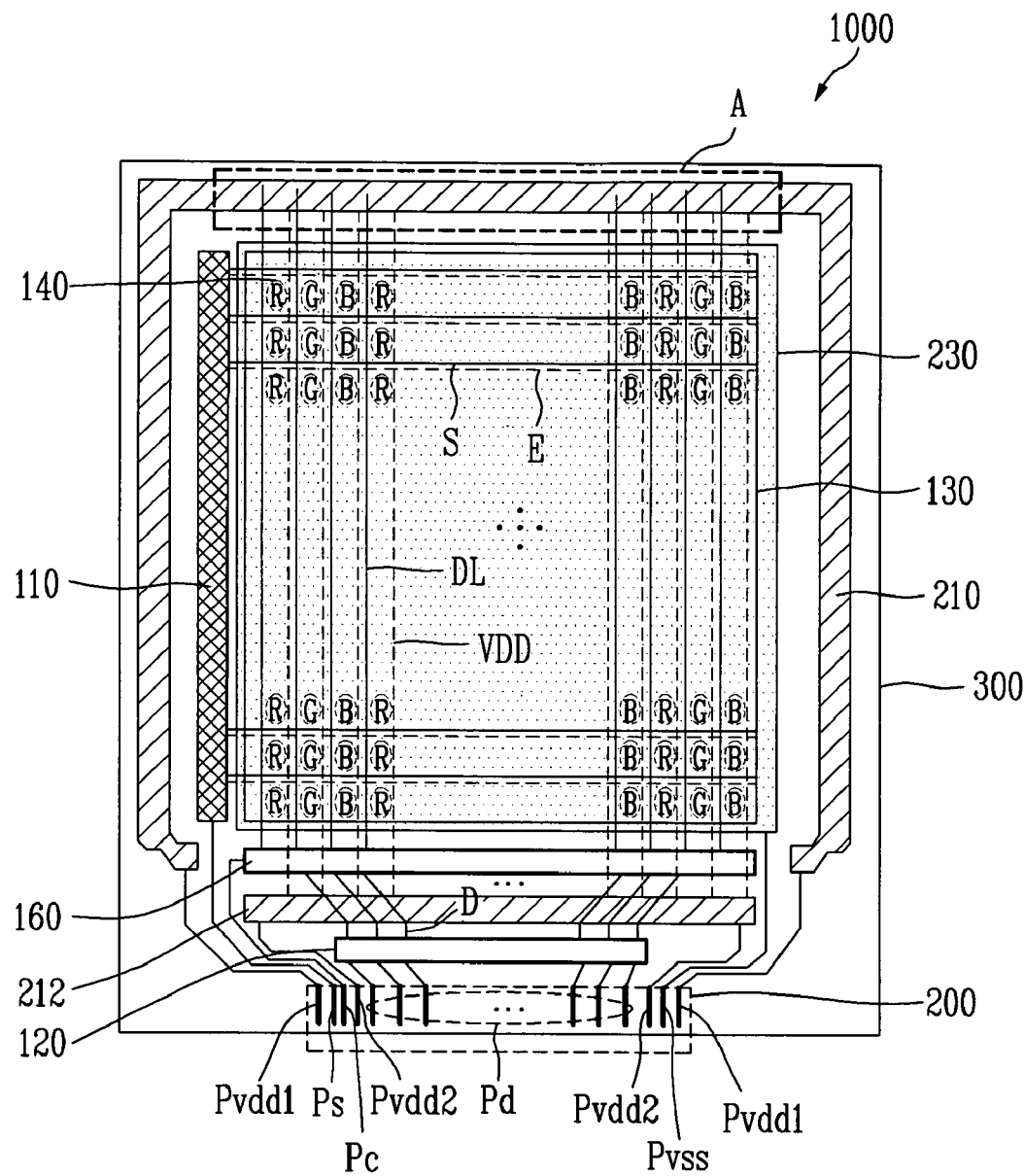
FIG. 7 illustrates a first layout of the organic light emitting display according to embodiments of the present invention.

FIG. 7 illustrates a first layout 1000 of the organic light emitting display according to embodiments of the present invention. The organic light emitting display having the first layout 1000 includes a pixel portion 130 formed on a substrate 300 and including a plurality of pixels 140 defined by a plurality of second data lines DL, a plurality of scan lines S, and a plurality of pixel power source lines VDD. The first layout 1000 also includes a first power source line 210 and an auxiliary power source line 212 coupled to the pixel power source line VDD, a data driver 120, and a demultiplexer block 160.

According to an embodiment of the present invention, the first layout 1000 of the organic light emitting display further includes a scan driver 110, a second power source line 230, and a pad part 200.

The scan driver 110 is located on one side of the pixel portion 130 and is electrically coupled to a first pad Ps of the pad part 200. The scan driver 110 supplies the scan signals SS to the scan lines S1 through Sn in sequence during the scan period of the one horizontal period 1H in response to the scan control signal SCS supplied from the first pad Ps.

The data driver 120 is electrically coupled to second pads Pd of the pad part 200 and to the first data line D. The data driver 120 generates a data signal corresponding to the data control signal DCS and the external data Data supplied from the second pads Pd, and supplies the generated data signals to the first data lines D. The data driver 120 supplies i data signals to the respective first data lines D during the data period of the one horizontal period 1H. The data driver 120 can be directly formed on the substrate 300, or embedded as a chip on the substrate 300. For example, the data driver 120 can be embedded as a chip on the substrate 300 by a chip-on glass method, a wire bonding method, a flip-chip method, a beam lead method, or the like.

The first power source line 210 is formed adjacent to all sides of the pixel portion 130 along the edges of the substrate 300 except where the pad part 200 is located. The first power source line 210 includes opposite ends coupled to a third pad Pvdd1 of the pad part 200. Further, the first power source line 210 supplies voltage received through the third pad Pvdd1 to first ends of the pixel power source lines VDD.

The auxiliary power source line 212 is formed to be adjacent to a bottom side of the pixel portion 130. The auxiliary power source line 212 includes opposite ends electrically coupled to a fourth pad Pvdd2 of the pad part 200. The auxiliary power source line 212 supplies the voltage received through the fourth pad Pvdd2 to second ends of the pixel power source lines VDD.

The second power source line 230 is formed over the area of the pixel portion 130. The second power source line 230 commonly supplies the voltage of the second power source line ELVSS received through a fifth pad Pvss of the pad part 200 to each pixel 140.

The demultiplexer block 160 supplies i data signals received through the first data line D to i second data lines DL in response to the control signals CS1, CS2, CS3 transmitted from a sixth pad Pc of the pad part 200. Further, the data signals sequentially supplied from the demultiplexer block 160 are stored in the data capacitor Cdata equivalently formed on the second data lines DL, and then supplied to the pixels 140 at the same time.

In the first layout 1000 of the organic light emitting display of the present invention, the data capacitors Cdata coupled to, or equivalently formed on, the second data lines DL are set differently according to overlapping areas between the second data line DL and the first power source line 210. The overlapping areas between the second data lines DL and the first power source lines 210 are varied taking into account voltage drop due to line resistance depending on the length of the first power source line 210. Thus, the data capacitors Cdata have different capacitance values according to the voltage drop in the first power source line, thereby allowing the organic light emitting display to display an image with uniform brightness.

Figure 8:
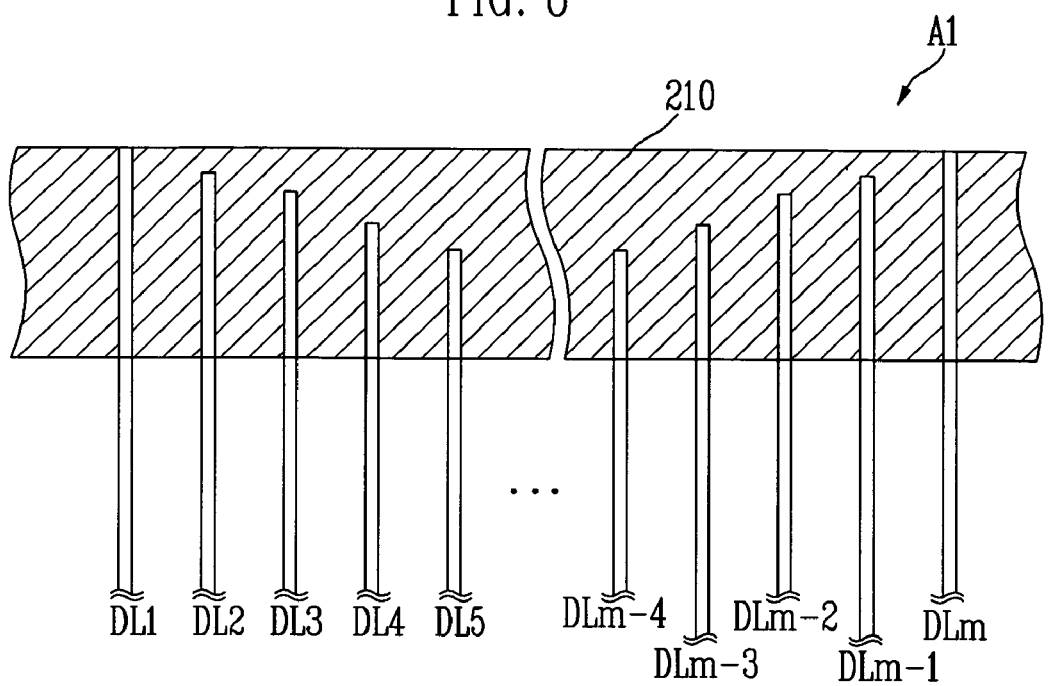
FIG. 8 is an enlarged view showing a first embodiment of portion A of the first layout shown in FIG. 7.

FIG. 8 is an enlarged view showing a first embodiment A1 of the portion A shown in FIG. 7. The second data lines DL are formed having the same line width, but different overlapping lengths with the first power source line 210 that result in different overlapping areas. Therefore, the consecutive second data lines DL have lengths that vary according to the location on the first power source line 210 where the second data line DL couples to the first power source line 210. The second power source lines DL becomes shorter as it goes from an edge portion of the first power source line 210 to a center portion. Thus, the overlapping areas between the first power source line 210 and the second data lines DL become smaller as the second data line DL goes from the $1^{st}$ second data line DL1 to the $(m/2)^{th}$ second data line DLm/2. Likewise, the overlapping areas between the first power source line 210 and the second data lines DL become larger as the second data line DL goes from the $(m/2+1)^{th}$ second data line DLm/2+1 to the $m^{th}$ second data line DLm. The gradual decrease in the overlapping areas and the subsequent gradual increase are symmetric such that the overlapping area between the $k^{th}$ second data line DLk and the first data line 210 is equal to that between $(m+1-k)^{th}$ second data line DLm+1-k and the first data line 210, where k is a positive integer less than m/2.

As explained above, the capacitance of the data capacitor Cdata become smaller going from the edge of the first power source line 210 to its center. This change in the capacitance values compensates for the voltage drop in the first power source line 210 from edges to center and allows the image to be displayed with uniform brightness.

Figure 9:
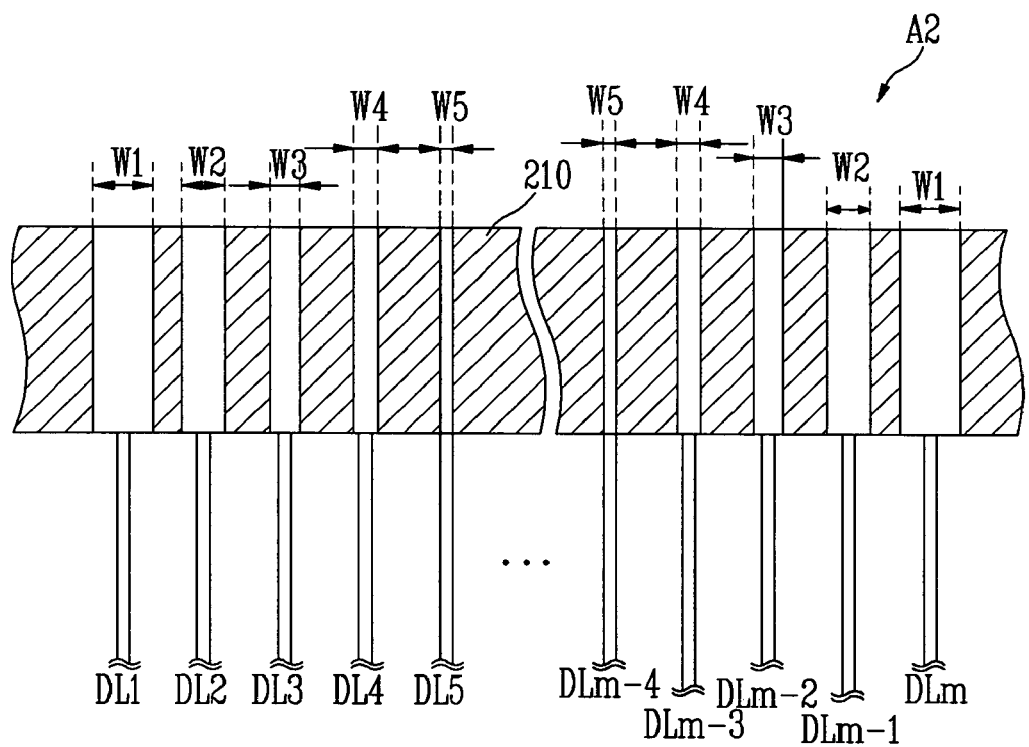
FIG. 9 is an enlarged view showing a second embodiment of portion A of the first layout shown in FIG. 7.

FIG. 9 is an enlarged view showing a second embodiment A2 of the portion A shown in FIG. 7. The second data lines DL shown in this figure also have different overlapping area with the first power source line 210. In this embodiment, the width of the overlapping areas of the consecutive second data lines DL with the first power source line 210 varies from the edges of the first power source line 210 to its center. The second data lines DL become successively narrower from an edge portion of the first power source line 210 toward its center portion.

Due to this successive narrowing of the overlapping areas, the $1^{st}$ second data line DL1 overlaps the first power source line 210 by a first width W1, and the $2^{nd}$ second data line DL2 overlaps the first power source line 210 by a second width W2 narrower than the first width W1. Similarly, the $m^{th}$ second data line DLm overlaps the first power source line 210 by the first width W1, and the $(m-1)^{th}$ second data line DLm-1 overlaps the first power source line 210 by the second width W2. Thus, the line width of the second power source line DL becomes narrower as it goes from the edge portions of the first power source line 210 to the center portion. Consequently, the capacitance of the data capacitors Cdata decrease going from the edges of the first power source line 210 to its center. Therefore, the voltage drop from the edges to the center of the first power source line 210 is compensated by the varying capacitances of the data capacitors Cdata and an image with the uniform brightness may be displayed.

Figure 10:
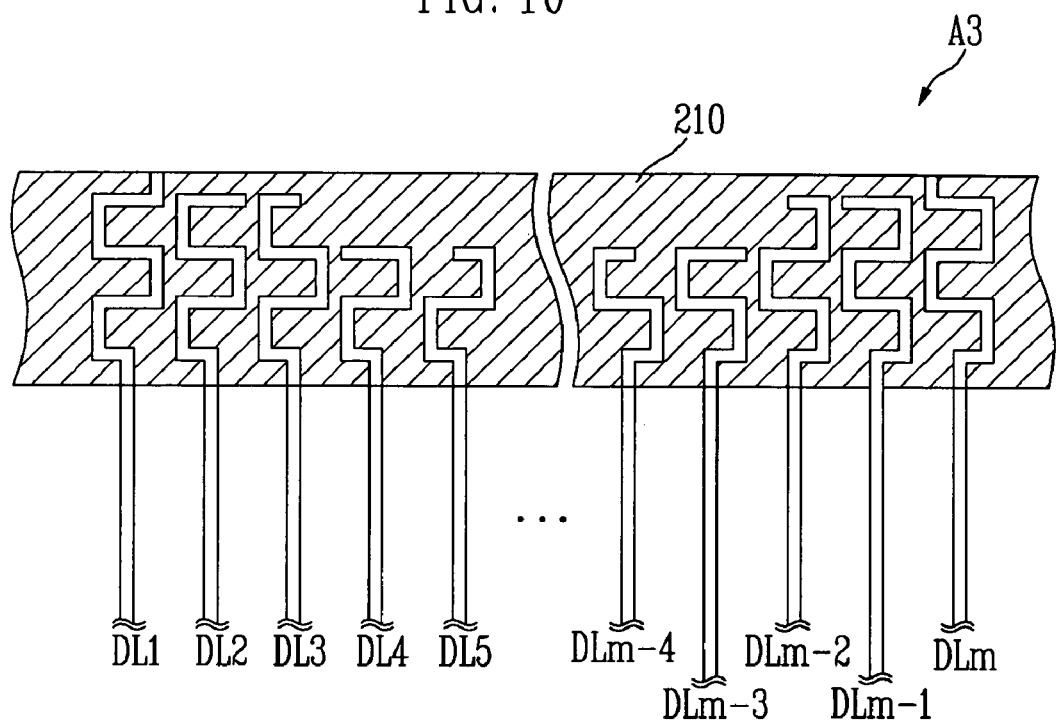
FIG. 10 is an enlarged view showing a third embodiment of portion A of the first layout shown in FIG. 7.

FIG. 10 is an enlarged view showing a third embodiment A3 of the portion A shown in FIG. 7. In this embodiment too, the second data lines DL have different capacitances that result from their different overlapping areas with the first power source line 210. As the figure shows, the second data lines DL are bent in S-shapes to have different lengths and therefore different overlapping areas with the first power source line 210.

The S-shaped curves of the second power source lines DL become shorter in consecutive lines from an edge portion of the first power source line 210 to a center portion. Thus, the overlapping areas between the first power source line 210 and the second data lines DL become smaller as the second data lines DL go from the $1^{st}$ second data line DL1 to the $(m/2)^{th}$ second data line DLm/2. Similarly, the overlapping areas between the first power source line 210 and the second data lines DL become larger as the second data lines DL go from the $(m/2+1)^{th}$ second data line DLm/2+1 to the $m^{th}$ second data line DLm. The symmetrical decrease and subsequent increase in the overlapping areas of the consecutive second data lines DL causes the overlapping area between the $k^{th}$ second data line DLk and the first data line 210 to be equal to that between $(m+1-k)^{th}$ second data line DLm+1-k and the first data line 210, where k is a positive integer less than m/2.

Thus, the capacitance values of the data capacitors Cdata become smaller going from the edges to the center of the first power source line 210, so that the voltage drop in the first power source line 210 is compensated for and an image may be displayed with uniform brightness.

Figure 11:
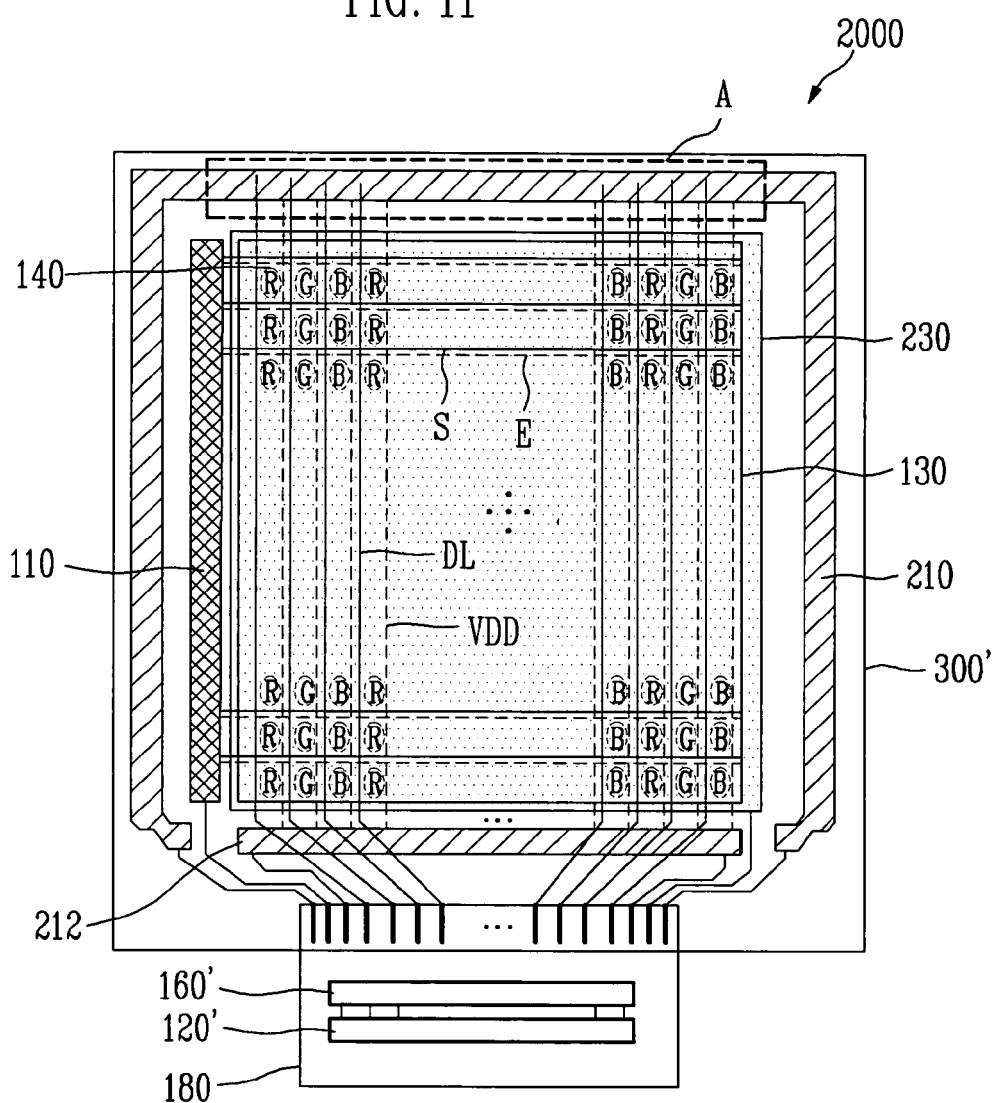
FIG. 11 illustrates a second layout of the organic light emitting display according to embodiments of the present invention.

FIG. 11 illustrates a second layout 2000 of the organic light emitting display of the present invention. In FIG. 11, the organic light emitting display has the same configuration as that illustrated for the second layout in FIG. 7 except for the location of the data driver 120 and the demultiplexer block 160 that are different.

The second layout 2000 includes a data driver 120' and a demultiplexer block 160' that are embedded on a flexible printed circuit 180 coupled to a substrate 300'. Thus, the data driver 120' and the demultiplexer block 160' are electrically coupled to a second data line DL through a pad part of the substrate 300, thereby supplying a data signal. Alternatively, the data driver 120' and the demultiplexer block 160' may be mounted on a chip on board mounted on a printed circuit board, a chip on film directly mounted on the film, a general film type connector used in a tape carrier package, or the like.

As described above, the present invention provides an organic light emitting display, in which a data signal received through one output line is split and supplied to a plurality of second data lines, thereby decreasing the number of output lines required and reducing production cost. In an embodiment, voltages corresponding to the data signals are sequentially charged in data capacitors, while the charged voltages are supplied to the pixels all at the same time. Because the voltages charged in the data capacitors are supplied to the pixels simultaneously, the organic light emitting display is allowed to display an image with uniform brightness. In an embodiment, scan periods for supplying the scan signals do not overlap with data periods for supplying the data signals. This feature yields a stable image. In an embodiment, the capacitance of a data capacitor is set depending on the emission efficiency of its corresponding organic light emitting diode, thereby keeping a proper white balance. In an embodiment, the capacitance of the data capacitor is set to compensate the voltage drop in the first power source line, thereby displaying an image with uniform brightness.

Although exemplary embodiments of the present invention have been shown and described, it would be appreciated by those skilled in the art that changes might be made to these embodiments without departing from the principles and spirit of the invention, the scope of which is defined in the claims and their equivalents.

What is claimed is:

1. An organic light emitting display comprising:
a scan driver to supply scan signals to a plurality of scan lines;
a data driver to supply data signals to a plurality of output lines;
a demultiplexer coupled to each output line to supply the data signals to a plurality of data lines;
a display region comprising a plurality of pixels, each pixel of the plurality of pixels coupled to a scan line of the plurality of scan lines and a data line of the plurality of data lines, and being adapted to emit light in accordance with a corresponding one of the data signals;
a first power source line at a periphery of the display region to supply a first power to the plurality of pixels through a plurality of pixel power source lines extending across the display region; and
a plurality of capacitors having different predetermined capacitances corresponding to different overlapping areas between the first power source line and respective said data lines, each of the capacitors adapted to store a voltage corresponding to a corresponding one of the data signals during a data period, and to supply the stored voltage to a corresponding pixel of the plurality of pixels as a data voltage representing the corresponding one of the data signals during a scan period that is different from the data period.

2. The organic light emitting display according to claim 1, wherein at least two data lines from among the plurality of data lines are different in length from each other in their respective overlapping areas with the first power source line.

3. The organic light emitting display according to claim 2, wherein the length of the respective overlapping areas of the at least two data lines and the first power source line becomes shorter going in a direction from an edge toward a center of the first power source line.

4. The organic light emitting display according to claim 3, wherein the at least two data lines are bent in an S-shape in the respective overlapping areas with the first power source line.

5. The organic light emitting display according to claim 1, wherein at least two data lines from among the plurality of data lines are different in width from each other in their respective overlapping areas with the first power source line.

6. The organic light emitting display according to claim 5, wherein the widths of the at least two data lines become narrower as the data lines go in a direction from an edge toward a center of the first power source line.

7. The organic light emitting display according to claim 1, further comprising an auxiliary power source line, wherein the pixel power source lines extending across the display region are coupled to the auxiliary power source line at an opposite side of the display region from the first power source line.

8. The organic light emitting display according to claim 1, further comprising a second power source line to supply a second power different from the first power to the pixels.

9. The organic light emitting display according to claim 1, wherein the scan driver is configured to supply each of the scan signals for a first period of one horizontal period, and the data driver is configured to supply the data signals to respective output lines from among the plurality of output lines for a second period of the one horizontal period excluding the first period.

* * * * *